United States Patent
Sri-Jayantha et al.

(10) Patent No.: US 6,876,550 B2
(45) Date of Patent: Apr. 5, 2005

(54) ACTIVE HEAT SINK FOR HIGH POWER MICROPROCESSORS

(75) Inventors: Sri M. Sri-Jayantha, Ossining, NY (US); Gerard MoVicker, Stormville, NY (US); Vijayeshwar Das Khanna, Millwood, NY (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 34 days.

(21) Appl. No.: 10/318,700

(22) Filed: Dec. 13, 2002

(65) Prior Publication Data

US 2004/0114327 A1 Jun. 17, 2004

(51) Int. Cl.⁷ ................................................. H05K 7/20
(52) U.S. Cl. ..................... 361/699; 165/80.3; 165/80.4; 165/185; 165/121; 361/704; 361/708; 361/710; 361/719
(58) Field of Search ................................ 165/80.2, 80.3, 165/80.4, 185, 121, 122, 126; 174/16.3; 257/706–707, 712–713; 361/687–710, 719–728; 415/176–178

(56) References Cited

U.S. PATENT DOCUMENTS

| | | |
|---|---|---|
| 5,309,983 A | 5/1994 | Bailey |
| 5,629,834 A | 5/1997 | Kodama et al. |
| 5,760,333 A | 6/1998 | Kitahara et al. |
| 5,785,116 A | 7/1998 | Wagner |
| 5,896,917 A | 4/1999 | Lemont et al. |
| 5,963,428 A * | 10/1999 | Salmonson et al. ......... 361/704 |
| 6,196,302 B1 | 3/2001 | Chuang |
| 6,243,263 B1 * | 6/2001 | Kitahara ..................... 361/695 |
| 6,538,887 B2 * | 3/2003 | Belady et al. .............. 361/695 |

FOREIGN PATENT DOCUMENTS

| | | |
|---|---|---|
| JP | 1996-8308180 B1 | 11/1996 |
| JP | 1996-8321571 B1 | 12/1996 |
| JP | 2000-091484 B1 | 3/2000 |
| JP | 2000-0244163 B1 | 9/2000 |
| JP | 2001-268847 B1 | 9/2001 |

OTHER PUBLICATIONS

From tennmax.com web site: "TennMax Lasagna XEON Cooler," TennMax United, Sep. 25, 2002 U.S.A.
From Yahoo! Shopping web site: "FCE–6010 Socket 370/7/A CPU Fan," Sep. 24, 2002, U.S.A.
From Icepak.com web site: "Fan Heat Sinks for High Performance Socket ICs," by Chris Chapman, Vivek Mansingh, and Prabhu Sathyamurthy, Sep. 24, 2002, pp. 1–3, U.S.A.
From Panasonic.com web site: "Flat Unidirectional Cooling Fans," Panasonic Industrial Company, U.S.A.
From maxcooler.com web site: "LAPTOP Slim Cooler" Order Form, Sep. 25, 2002, U.S.A.

* cited by examiner

*Primary Examiner*—Gregory Thompson
(74) *Attorney, Agent, or Firm*—Michael J. Buchenhorner

(57) ABSTRACT

A cooling apparatus for cooling a heat source such as a microprocessor, comprising a mobile heat sink placed in close proximity to the heat source; and a thermal conductor for conducting heat generated by the heat source to the mobile heat sink.

19 Claims, 7 Drawing Sheets

Conventional Heat Sink

Proposed Active Heat Sink

Top View w/ Circuit board removed

Ball Bearing Motor with Fluid Heat Coupling
(Rotating Shaft Design)

ACTIVE HEAT SINK FOR HIGH POWER MICROPROCESSORS

FIELD OF THE INVENTION

The invention disclosed broadly relates to the field of cooling devices for electronic components, and more particularly relates to the field of heat sinks for microprocessors.

BACKGROUND OF THE INVENTION

During the normal operation of a computer, integrated circuit devices generate significant amounts of heat. This heat must be continuously removed, or the integrated circuit device may overheat, resulting in damage to the device and/or a reduction in operating performance. Cooling devices, such as heat sinks, have been used in conjunction with integrated circuit devices in order to avoid such overheating. Generally, a passive heat sink in combination with a system fan has provided a relatively cost-effective cooling solution. In recent years, however, the power of integrated circuit devices such as microprocessors has increased exponentially, resulting in a significant increase in the amount of heat generated by these devices, thereby necessitating a more efficient cooling solution.

Heat sinks operate by conducting heat from the processor to the heat sink and then radiating it into the air. The better the transfer of heat between the two surfaces (the processor and the heat sink metal) the better the cooling. Some processors come with heat sinks glued to them directly, or are interfaced through a thin and soft layer of thermal grease, ensuring a good transfer of heat between the processor and the heat sink.

FIG. 1 shows a conventional heat sink assembly 100 attached to a microprocessor. This conventional heat sink 100 would most commonly be used in conjunction with a separate fan unit. Directional airflow provided by the fan ensures efficient heat transfer from the fins (102) of the heat sink 100 to the ambient air. Thermal grease 104 is used as a conductive substance to transfer heat from the processor die (chip) 110 to the heat spreader 106 and onto the heat sink fins 102. The thermal grease 104 helps bond the two surfaces and transfer the heat more effectively. The processor die (chip) 110 is secured to the ceramic base 112 using a die attach method incorporating solder balls 120.

An enhancement on the above structure is sometimes achieved by adding a fan (not shown) that blows cooling air at the chip package. Such a conventional fan heat sink assembly suffers from two types of inefficiencies. First, the airflow generated by the fan blades diffuses into the open space and only a portion of the airflow impinges on the fins 102 of the heat sink 100. Even with proper shrouding, added to direct the airflow over the fins of a heat sink, the fins located downstream from the airflow see less vigorous thermal interaction with the impinging air due to the deceleration of the airflow and the build up of a boundary layer. Second, as processing power continues to increase, the combined mass/volume of the fan-heat sink system needs to grow in scale accordingly, thus making the fan-heat sink configuration less competitive in a size-driven market.

By integrating a fan with a passive heat sink module, a heat sink configuration of smaller size and increased thermal efficiency (i.e., reduced thermal resistance or increased thermal conductivity) is obtained. Fan heat sinks (a heat sink with integrated fan) have been used to address the greater cooling needs of today's microprocessors, and in some cases they provide the only viable solution. An example of this would be the cooling of embedded personal computers (PCs) in hazardous industrial locations where particles or corrosive fumes occupy the same environment as the PC. Sealing the chassis is the best way to ensure long life. Fan heat sinks can cool sensitive chips in this sealed environment, offering a solution where traditional methods fail. Some low-end personal computers (PCs) use fan heat sinks in place of a system fan. This solution lowers the overall cost and provides a quieter system. Since office noise level requirements are stricter in Europe, many PCs made for the European market use fan heat sinks specifically to lower the noise level An integrated fan improves the performance of any heat sink by about 50 to 100%. The directional airflow provided by the fan ensures more efficient heat transfer from the fins 102 to the ambient air. When fan heat sinks are engineered into the system they can provide many years of uninterrupted service. —From "Fan Heat Sinks for High Performance Socket ICs" by Chris Chapman, Vivek Mahnsingh and Prabhu Sathyamurthy, 2002. However, as functionality and processor speed increase, conventional fan heat sinks will no longer be able to supply the total cooling for systems, requiring alternative cooling strategies.

The effectiveness or heat transfer capability of a heat sink is a function of its surface area, the temperature difference between the heat sink and the fluid (air) moving past the heat sink, and a heat transfer coefficient $h_c$. The heat transfer coefficient $h_c$ in turn depends upon such factors as the geometry of the fluid flow and its velocity past the heat sink surfaces. The equivalent thermal resistance of an airflow-based cooling system is governed by three factors:

1. heat resistance of the heat sink (this is determined by the material and the effective distance to the heat source);
2. effective surface area exposed to convection airflow; and
3. rate of airflow over heat transfer area.

Current heat sinks address the cooling needs of today's microprocessors, but in order to address the increasingly complex and expensive cooling needs of the next generation microprocessors, there is a need for a thermal cooling system which can overcome the shortcomings of the prior art by providing superior cooling efficiency in a compact form factor.

SUMMARY OF THE INVENTION

Briefly, according to the invention, a cooling apparatus (Active Heat Sink) for cooling a heat source such as a microprocessor, comprises a mobile heat sink placed in close proximity to the heat source; and a thermal conductor for conducting heat generated by the heat source to the mobile heat sink. The mobile heat sink provides the dual functionality of the heat dissipation surface (e.g. fins) and the airflow generator (e.g. fan) of the prior art.

DESCRIPTION OF THE PREFERRED EMBODIMENTS

It is an advantage of this invention, henceforth referred to as an active heat sink, to provide a more efficient microprocessor cooling system by transferring heat to a mobile heat sink, in particular by dissipating the heat into the rotating portions of a fan such as the shaft and the fan blades. The drawings described here will serve to illustrate this and other further uses and advantages of the instant invention.

Figure 1:
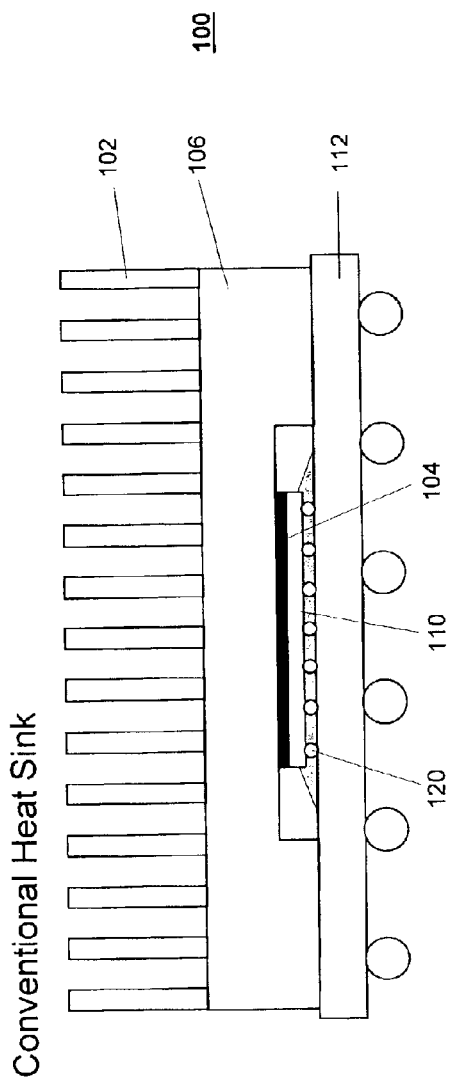
FIG. 1 is an illustration of a conventional heat sink, according to the known art.
Figure 2:
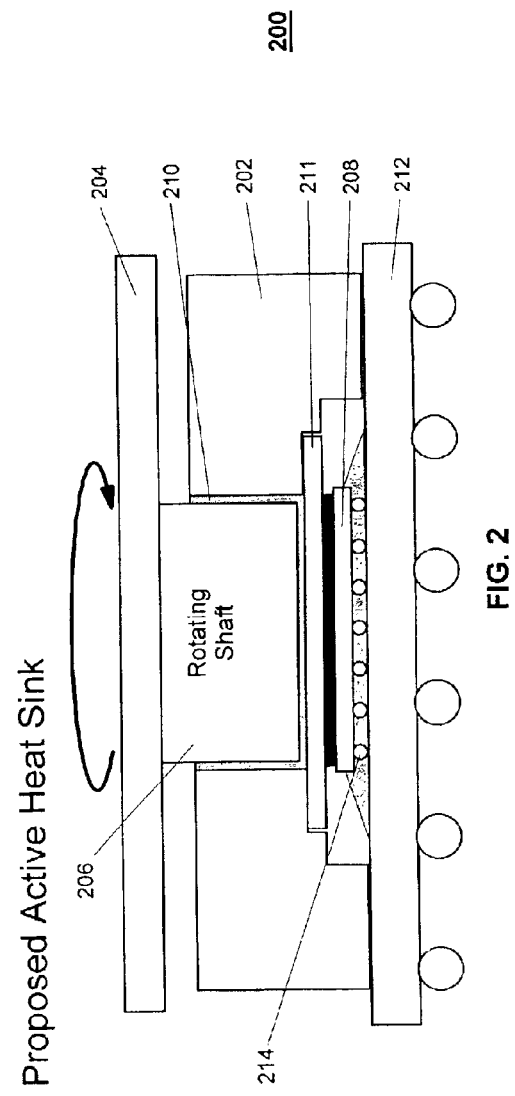
FIG. 2 is an illustration of an active heat sink, according to an embodiment of the present invention.

Referring to FIG. 2, there is shown a diagram of a cooling apparatus 200 for a heat source such as a microprocessor die 208. This cooling apparatus 200 comprises a mobile heat sink. The mobile heat sink comprises a rotating metallic fan, composed of fan blades 204 and a rotating shaft 206, which takes the place of the fins 102 of the conventional heat sink 100 shown in FIG. 1. The bottom end of the rotating shaft 206 is placed in close proximity to the processor die, or chip, 208 so that heat generated by the die 208 can effectively flow into the shaft 206 for transport to the blades 204. Ideally, the shaft 206 is located above the die 208 in a location that is as close to the die 208 as possible without interfering with the rotational properties of the shaft 206.

The fan blades 204 provide airflow in an axial-in, radial-out pattern. This pattern is appropriate for a notebook computer configuration or other such configuration where a compact form factor would be required. In other applications where profile height is not critical, the airflow can be axial-in, axial-out. Profile height is an important consideration because the heat sink 200 must have sufficient clearance above it in order to perform to specification.

In the preferred embodiment, the fan blades 204 comprise a geometry and rotation pattern such that the airflow is directed away from the die 208 so that the heat flowing from the die 208 through the shaft 206 and into the fan blades 204 is dissipated into the environment surrounding the cooling apparatus 200. The fan blades 204 and shaft 206 must be constructed from a material with a high rate of thermal conduction, such as copper or aluminum. In addition, the fan blades 204 should have a rough surface area as opposed to the smooth surface area of conventional fan blades. The reason for this will be discussed later with reference to FIG. 5.

Apparatus 200 also comprises a substrate or base 212 on which the die 208 is mounted and connected by means of solder connections 214. The fan base housing 202 is mounted on the base 212 by a mechanical attachment. According to the preferred embodiment, a thin film of fluid 210 is introduced between the housing 202 and the shaft 206 for assisting the flow of heat from the stationary housing 202 to the rotating shaft 206 and onto the fan blades 204. This fluid 210 is introduced during assembly of the heat sink 200 and is preferably a synthetic or mineral oil having high thermal capacity and/or high heat conductivity properties which will not degrade as a result of exposure to high temperatures. Water, for example, would not be a good choice because water will boil and evaporate when exposed to high heat, thus necessitating replacement of the fluid. The fluid film gap in the heat sink is made as thin as practically possible.

By positioning the fluid film 210 between the stationary and moving members a minimum heat resistant configuration is developed. The rotation of the shaft 206 causes the fluid 210 to circulate around in its channel; this in turn augments transfer of heat to the moving shaft 206 and blades 204. The fluid 210 is self-retained within the volume provided for it by virtue of its surface tension at the interface where it comes into contact with ambient air. Optionally, a conventional sealing method could be employed to further contain the fluid 210.

In one of the preferred embodiments, the thin fluid layer is preferably 3–10 micrometers ($\mu$m) in thickness. This allows the same fluid to act as a fluid dynamic bearing (FDB) system and provide the load carrying function for the mobile portion of the heat sink. The load carrying capacity is conventionally achieved by means of "grooves" or "channels" etched, stamped or deposited on either the stationary or the moving portion of the fluid cavity. The grooves generate the necessary build up of hydrodynamic pressure to support the weight of the mobile portion of the heat sink.

In this embodiment, the fluid 210 is said to be self-circulating, or "self-pumping," meaning that the fluid 210 will continuously distribute itself throughout the channel thereby covering a greater surface area. The rotation of the shaft 206 will agitate the fluid film 210 and disperse it throughout its channel. This fluid distribution can be further optimized by etching grooves or adding geometries onto the surface of the shaft 206 to increase its surface roughness. This surface roughness, combined with the movement of the rotating shaft 206, optimizes the fluid circulation. The amount of fluid circulation is optimized and traded-off with the mechanical torque generation needed. Clearly the more vigorously and extensively the fluid flows within its contained volume the better the thermal efficiency, but the penalty is the electrical power needed to rotate or move the mobile portion of the heat sink.

In this embodiment, the fluid film 210 serves three purposes: 1) it acts as a superior heat transfer interface since circulating fluid effectively enlarges the high temperature surface of the processor die; 2) it provides rotational support for the fan unit; and 3) it provides lubrication for the rotating shaft 206 of the fan thereby eliminating metal-to-metal friction. This lack of metal-to-metal friction means that the unit can withstand higher rotational speeds and will increase the product life. In addition, by positioning the fluid film 210 in close proximity, as low as 100 $\mu$m, to the heat generating source, (in this case the processor die 208) the distance from the heat source 208 to the air flow region (the fan blades 204) can be minimized, thus increasing the thermal conductivity from the heat source to the ambient air The proximity of the liquid to the heat source is governed by the thickness of a thrust cap 211 (explained later) needed to contain the fluid. The thickness of the thrust cap 211 can be further reduced by choosing an esoteric material that has both strength and thermal conductivity. Natural diamond crystal appears to be the most superior material for this function even though the cost can be prohibitive for most commercial embodiments. However, it allows the heat to be transferred to the liquid film 210 from the surface of the processor die 208 through a maximally efficient medium. Alternatively, a copper thrust cap 211 with a novel coating of wear resistant material may be the more economical choice.

Figure 3:
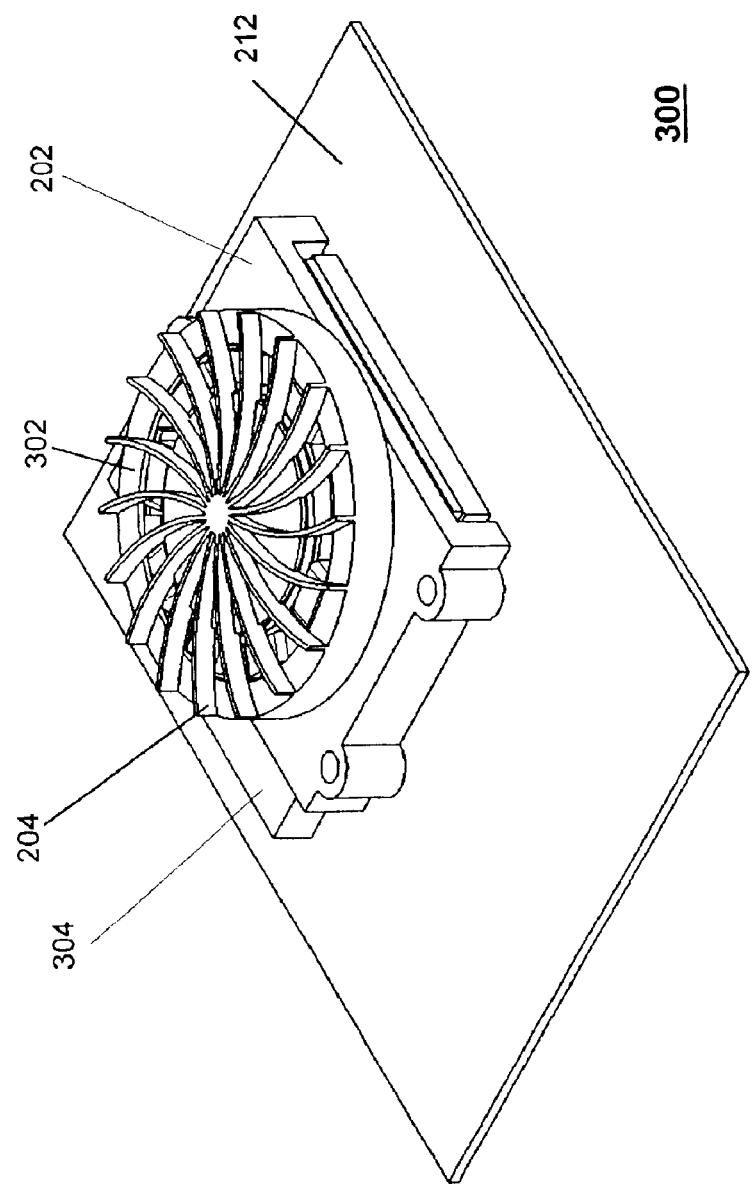
FIG. 3 shows is an oblique view of an active heat sink.

Referring now to FIG. 3 we see an oblique view 300 of the active heat sink 200 showing the fan 302, the base housing 202, a processor receptacle 304 and a circuit board 212. The fan 302 shows the blade geometry corresponding to an axial-in, radial-out airflow pattern. An objective would be to achieve an optimum fin surface area, number of fins (fan blades 204), and surface roughness in order to maximize heat transfer effectiveness.

Blade geometry is important to the cooling effectiveness of fans in general. In this embodiment, the blade geometry shown is different from that used in conventional cooling devices. Conventional fans, in accordance with known aerodynamic principles, use smooth-surfaced, streamlined fan blades to achieve maximum airflow and to avoid turbulence. It is a further advantage of this invention to use fan blades 204 which are designed to be thermally coupled in an optimal way, in contrast to conventional fan blades. In a preferred embodiment, the fan blades 204 would create a lot of turbulence at their surface in order to maximize heat transfer from the fan surface to air molecules. This increased turbulence would be facilitated by creating a rough texture to the surface of the fan blades 204. This could be done by pitting or etching the blades, or by the addition of bumps, dimples (as in golf balls) or grooves on the surface of the blades 204.

In addition to using surface roughness of the blades to create turbulence, heat dissipation is also maximized by blowing the air away from the heat source (the processor die, or chip 208). This is why the fan blades 204 are designed to generate an axial-in, radial-out airflow pattern shown in FIG. 3 and also described in FIG. 5. This again is in contrast to conventional fan blade configurations used in heat sink fans where the approach is to blow cool air onto the heat source, or chip, in order to cool it. In this embodiment, it is desirable to blow the heated air away from the chip to maximize heat dissipation.

Figure 4:
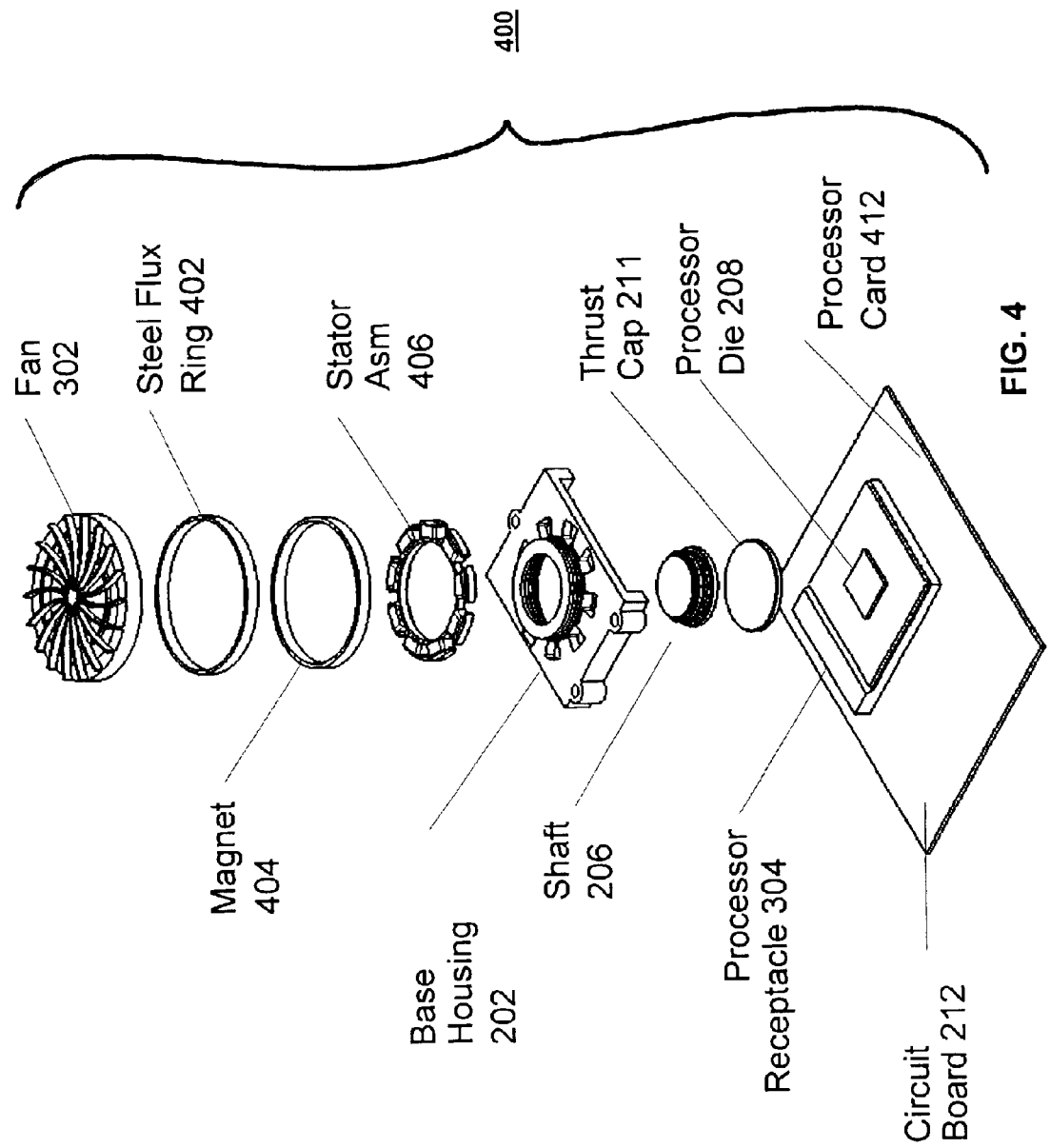
FIG. 4 shows an exploded view of the components in an active heat sink.

We will now show how an embodiment of the invention is constructed and what materials are used. We turn now to FIG. 4 which shows an exploded view 400 of the active heat sink 200 components. In addition to containing an FDB element, the active heat sink 200 must also have a torque generating structure. Precision speed control is not a critical requirement for an active heat sink. The airflow path, according to the blade geometry shown of the fan 302, corresponds to an axial-in, radial-out airflow pattern, as discussed earlier. Beginning from the top, the components are: the fan 302, a steel flux 20 ring 402, a magnet 404, stator assembly 406, base housing 202, rotating shaft 206, thrust cap 211, and a circuit board 212 on which is disposed a processor receptacle 304, supporting a processor die (chip) 208. The function of the thrust cap 211 is to contain the fluid 210 next to the bottom flange of a rotating shaft 206. In one embodiment, the flange element provides the thrust resistance necessary to counter-balance the weight of the fan 302 assembly, for instance. Therefore the thrust cap 211 should not only keep the fluid 210 trapped within the FDB without any leakage, but it should also be able to withstand the fluid pressure due to the thrust generated, in this case by the rotation of the shaft.

Figure 5:
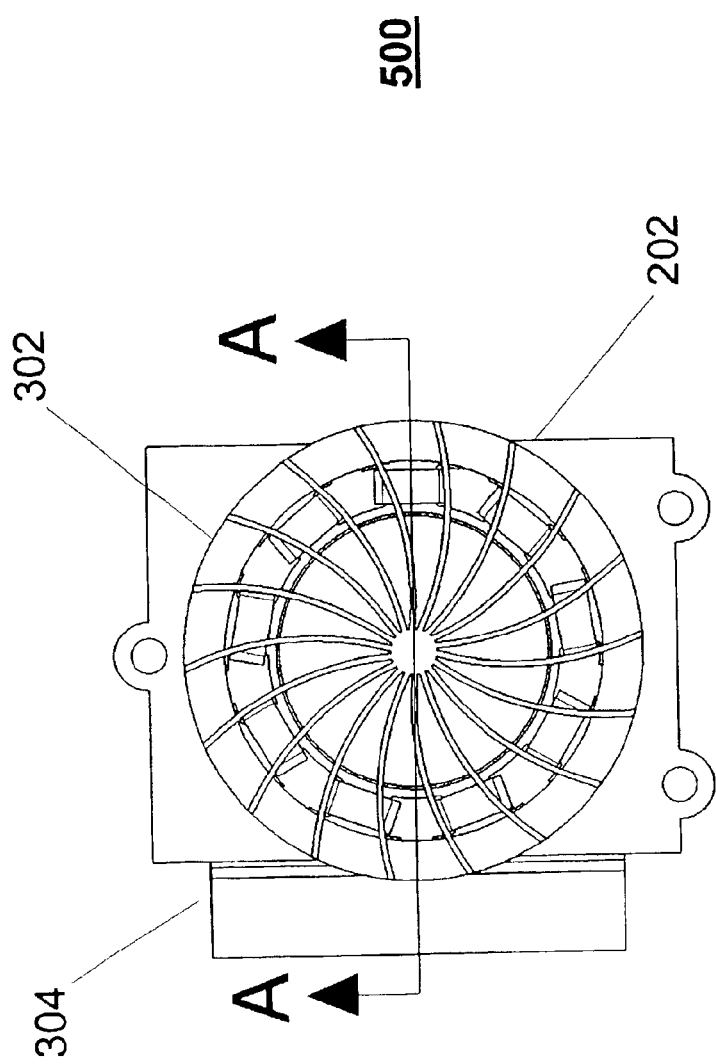
FIG. 5 shows a top view of an active heat sink.

FIG. 5 shows a top view of the active heat sink 200 without the circuit board 212. In this diagram you can get a better view of the blade geometry of the fan 302, showing the axial-in, radial-out airflow pattern discussed earlier. As shown, the fan 302 is situated on the base housing 202 which in turn is housed on the processor receptacle 304.

Figure 6:
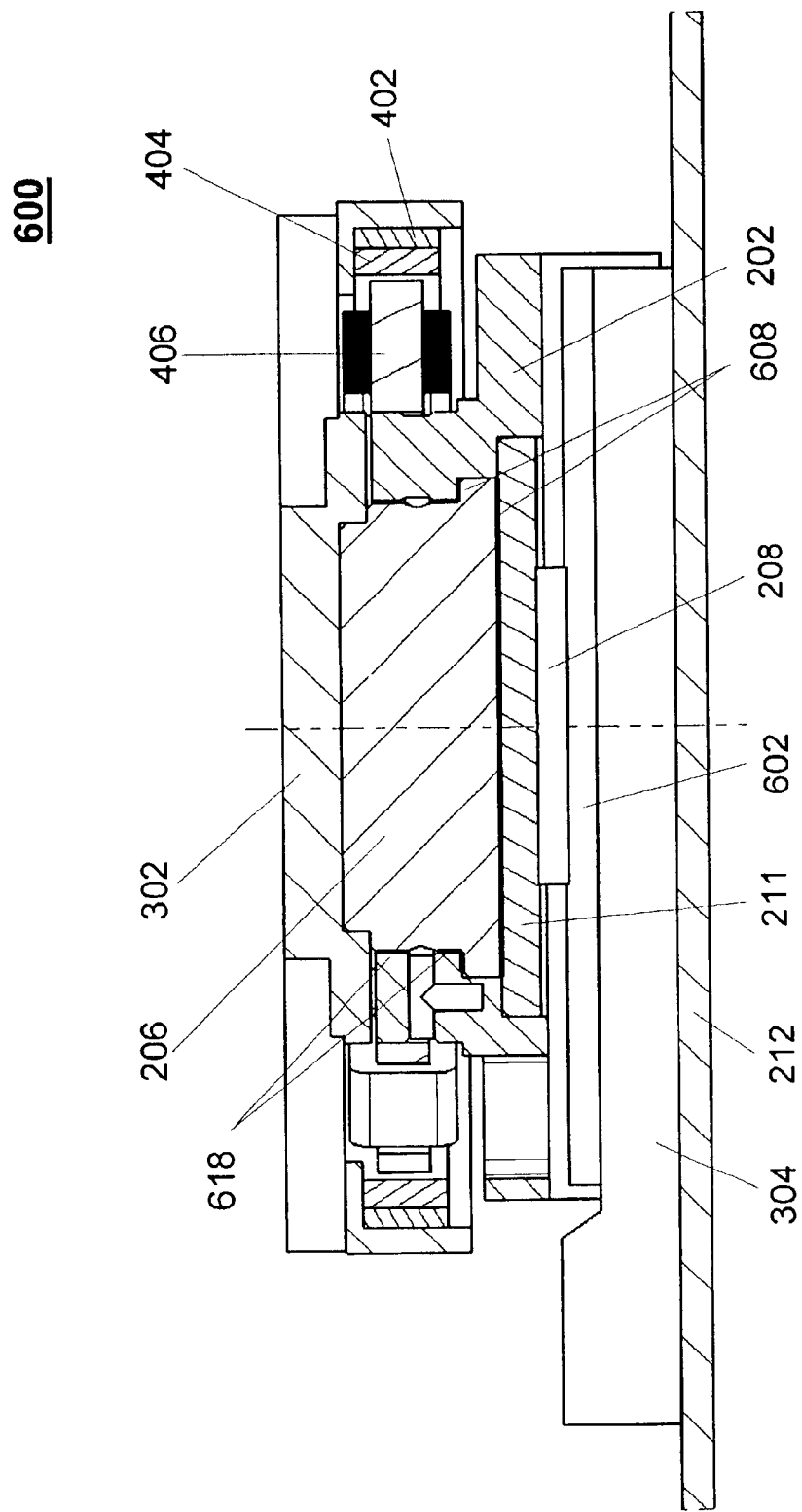
FIG. 6 shows a cross-section view of an active heat sink, according to an embodiment of the invention.

FIG. 6 shows a cross section view of an active heat sink 600 that incorporates a motor with fluid dynamic bearing. Beginning from the top, you see the fan 302 housed over the rotating shaft 206. The stator assembly 406 is shown in black to distinguish it from its surroundings. A magnet 404, steel flux ring 402, radial bearings 618, and thrust bearing 608 are all configured on the base housing 202. The base housing 202 in turn is disposed over a thrust cap 211 which in turn tops a processor die (chip) 208. The chip 208 is attached to a die base 602 which in turn is disposed on a processor receptacle 304 over a circuit board 212.

Figure 7:
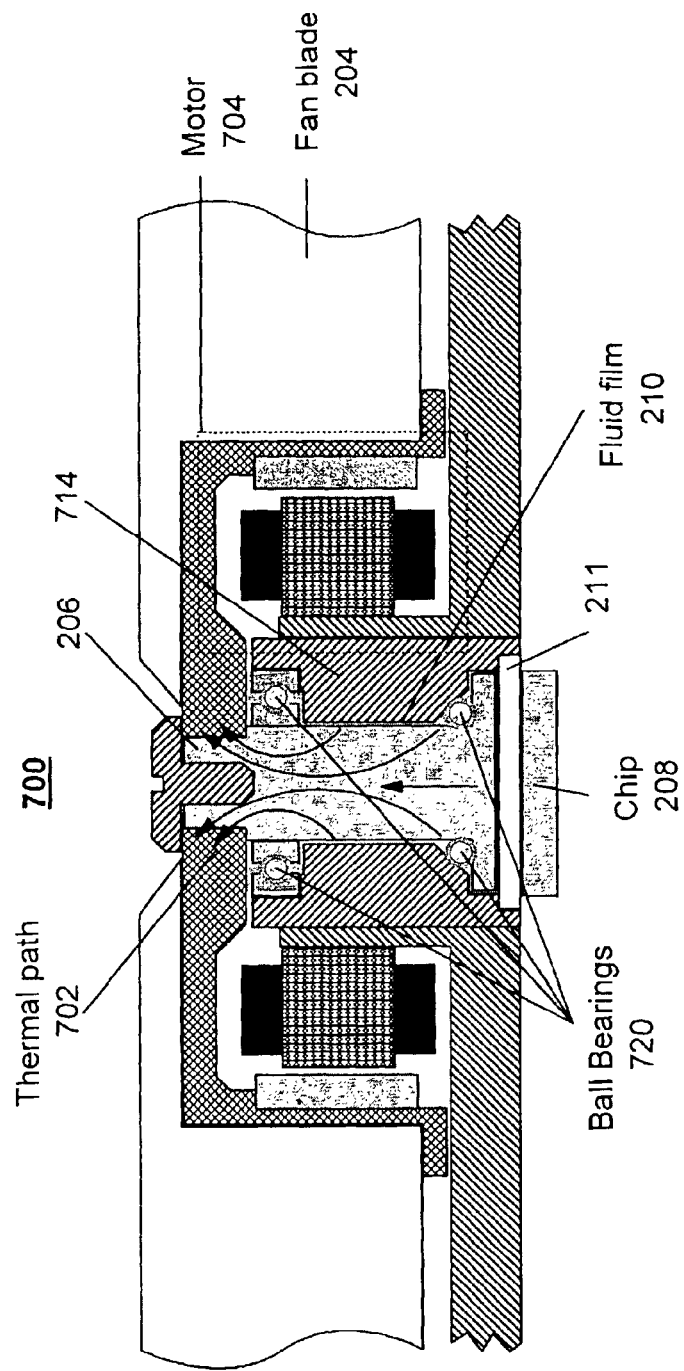
FIG. 7 shows a cross-section view of a ball bearing motor with fluid heat coupling and a rotating shaft, according to a further embodiment of the invention.

Used in an active heat sink, a FDB provides rotational support for the fins (fan blades 204) and also provides the heat transfer interface. However, in contrast to the precision requirements of a hard disk drive, the active heat sink system does not require mechanical precision of the rotating fan blades 204. Hence the ease of manufacturing the FDB for use in the above embodiment can be improved, while exploiting its self-pressuring function and self-containing design features, by increasing the thickness of the fluid film (to 5 to 10 $\mu$m) and thereby relaxing the machining tolerances on the bearing components. Also as the hard drive industry starts using fluid dynamic bearings in the spindle motors of more and more products, it will result in a large increase in the numbers of FDB manufactured Since the requirements of a FDB function can impose undesirable restrictions on material properties and tolerances, a ball bearing augmented system, as shown in FIG. 7, is provided as an alternative embodiment. FIG. 7 shows a cross-section of a ball bearing motor with fluid heat coupling and a rotating shaft design. In this design, the ball bearings 720 provide the rotational support structure while a relaxed FDB-like film 210 (with the fluid gap dimensions increased to 10–20 $\mu$m or more) provides the heat transfer interface. The outer housing for the ball bearings 720 also forms the outer surface for the fluid film 210. Note that in this configuration a thrust generating element is not needed since ball bearings provide both radial and axial load carrying function. The cross-section walls 714 (shown with a diagonal "\\\" cross-hatch pattern) do not serve a bearing role but will dissipate the heat carried by the fluid 210. It is understood that the fluid film 210 can be self-pumped to move through geometries that are optimum for heat transfer and may have complicated passages. A key invention is the use of fluid film 210 to provide a thermal interface that allows the source to be stationary but the sink to be rotating while simultaneously generating a desired airflow pattern over the fan blades 204 for maximum heat transfer. The thermal path 702 shows how the heat is transferred from the source (the chip 208) up through the cap 211. The fluid film 210 absorbs much of this heat and conducts it through the rotating shaft 206 out onto the fan blade 204. The motor 704 controls the movement of the rotating shaft 206.

This diagram illustrates another benefit and advantage to the fluid film 210. In this figure, you can see that the heat source, which in this case is the chip 208, is a small surface, especially in relation to the amount of heat it can generate. It is an objective of heat dissipation mechanisms to map a small surface to a much larger surface in order to maximize the potential for heat transfer away from the die 208 into ambient air. New applications can be envisaged where the ambient air is replaced by another fluid medium to maximize heat removal from the fan blades themselves. The fluid film 210 aids in this regard by transference of heat from the small chip 208 to the much larger surface area of the fan unit.

Figure 8:
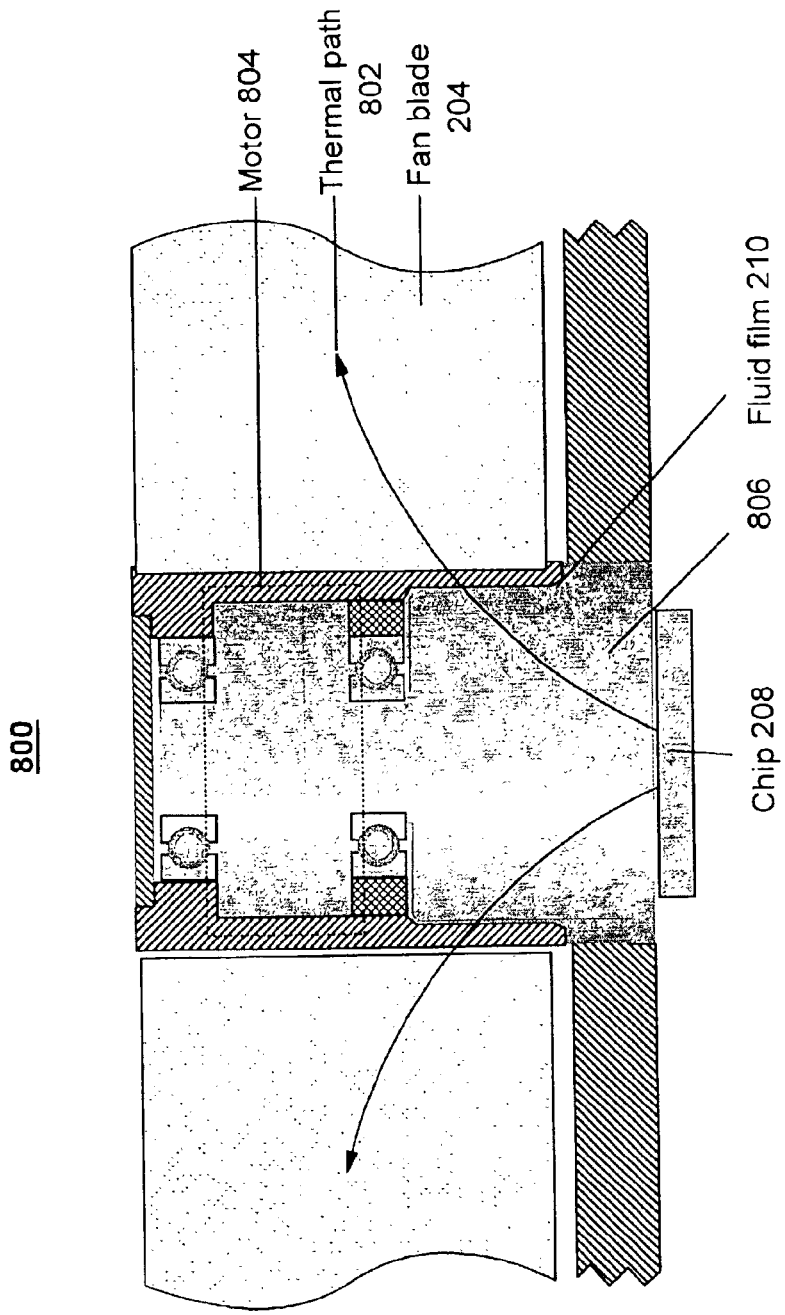
FIG. 8 shows a cross-section view of a ball bearing motor with fluid heat coupling and a stationary shaft, according to a still further embodiment of the invention.

FIG. 8 is a cross-sectional view of a ball bearing motor with fluid heat coupling as in FIG. 7, but unlike the motor of FIG. 7, this motor uses a stationary shaft design. The motor 804 is housed around the stationary shaft 806. The fluid film 210, as in other embodiments, is distributed in a well so that it is in contact with the stationary shaft 806. In this embodiment, the shaft 806 is stationary, so the fluid film 210 does not serve all of the same purposes as in other embodiments which employ a rotating shaft. For example, the fluid film 210 in this example does not serve a lubricating purpose. It is still effective, however, in helping to conduct the heat away from the heat source (the die, or chip 208) and into the rotating blade 204. This underscores the importance of choosing a fluid with a high heat transfer capability with the help of self-pumped circulation. The heat is dispersed from the chip 208 through the shaft 806. The fan blades 204 help to disperse the heat from the shaft 806 out into the ambient air as shown by the thermal path 802. It should be understood that, while this is an example of an embodiment wherein the present invention could be used, it is not the ideal configuration. While the embodiment with a rotating shaft shown in FIG. 7 is superior in terms of cooling efficiency, this example is presented here to show the adaptability of the invention.

Therefore, while there has been described what is presently considered to be a preferred embodiment, it will be understood by those skilled in the art that other modifications can be made within the spirit and scope of the invention.

We claim:

1. A cooling apparatus, for cooling a heat source, comprising:
   a mobile heat sink for placement in close proximity with the heat source, the mobile heat sink comprising a rotating shaft and one or more fan blades attached to the rotating shaft;
   a thermal conductor for conducting heat generated by the heat source to the mobile heat sink, the thermal conductor comprising a fluid film disposed between the heat source and the heat sink; and
   surface features on the rotating shaft so that the fluid film is self-circulating.

2. The apparatus of claim 1 further comprising a driver machine for driving the mobile heat sink into motion such that heat received from the heat source is dissipated into a space in the proximity of the mobile heat sink.

3. The apparatus of claim 2 wherein the driver machine comprises a motor for rotating the rotating shaft.

4. The apparatus of claim 1 wherein the fluid film comprises a material capable of transporting heat from a stationary heat source to a moving object.

5. The apparatus of claim 1 wherein the one or more fan blades comprise a non-smooth surface such that significant turbulent airflow near the non-smooth surface is generated by rotating the rotating shaft.

6. The apparatus of claim 2 wherein the driver machine drives the rotating shaft to rotate such that airflow is generated in a direction away from the heat source.

7. The apparatus of claim 1 integrated with the heat source.

8. The apparatus of claim 1 wherein the fluid film comprises oil.

9. The apparatus of claim 1 further comprising a ball-bearing augmented system.

10. The apparatus of claim 1 wherein the one or more fan blades comprise an axial-in, radial-out blade geometry.

11. The apparatus of claim 1 wherein the one or more fan blades comprise an axial-in, axial-out geometry.

12. An apparatus for cooling a heat generating electronic device, comprising:
    a fan assembly for attaching to a circuit board for supporting a heat-generating electronic device, the fan assembly comprising a moving member and a stationary member;
    the fan assembly further comprising a rotating fan positioned in close proximity to the heat-generating electronic device such that the fan generates airflow in the direction away from the heat-generating electronic device; and
    a fluid film located near the heat-generating electronic device such that heat generated by the electronic device is transferred through the fluid film to the rotating fan, the fluid being contained in a space between the moving and stationary members of the fan assembly.

13. The apparatus of claim 12 wherein the moving member comprises a rotating shaft and one or more blades attached to the shaft.

14. The apparatus of claim 12 wherein the fluid film comprises a material with high thermal conductivity.

15. A cooling apparatus, for cooling a heat source, comprising:
    a rotating heat sink for placement in close proximity with the heat source, the rotating heat sink comprising a rotating shaft and one or more fan blades attached to the rotating shaft;
    a thermal conductor for conducting heat generated by the heat source to the rotating heat sink, the thermal conductor comprising a fluid film disposed between the heat source and the rotating heat sink and surface features on the rotating shaft so that the fluid film is self-circulating.

16. The apparatus of claim 15, further comprising:
    a driver machine for driving the rotating heat sink into motion such that heat received from the heat source is dissipated into a space in the proximity of the rotating heat sink.

17. The apparatus of claim 16, wherein the driver machine comprises a motor for rotating the rotating shaft.

18. The apparatus of claim 15, wherein the fluid film comprises a material capable of transporting heat from a stationary heat source to a moving object.

19. The apparatus of claim 15, wherein the one or more fan blades comprise a non-smooth surface such that significant turbulent air flow near one or more fan blade surfaces is generated by rotating the rotating shaft.

* * * * *